March 17, 1959 F. WOHLMAN 2,877,533

MOUNTING DEVICE FOR SEMICONDUCTOR BODIES

Filed March 30, 1955

2 Sheets-Sheet 1

FRED WOHLMAN
INVENTOR.

BY Henry Heyman
ATTORNEY.

FRED WOHLMAN
INVENTOR.

BY Henry Heyman

ATTORNEY.

United States Patent Office 2,877,533
Patented Mar. 17, 1959

2,877,533

MOUNTING DEVICE FOR SEMICONDUCTOR BODIES

Fred Wohlman, Inglewood, Calif., assignor to Hughes Aircraft Company, Culver City, Calif., a corporation of Delaware Application March 30, 1955, Serial No. 497,886

14 Claims. (Cl. 29—25.3)

The present invention relates generally to a device for mounting semiconductor bodies in partially assembled semiconductor translating devices, and relates more specifically to a device for accurately affixing and positioning any one of various types of semiconductor bodies on a portion of a semiconductor translating device.

In the manufacture of semiconductor translating devices such as, for example, transistors of various types, diodes or rectifiers, photocell devices and the like which employ either simple semiconductor bodies or semiconductor monatomic bodies which may take the form of germanium, silicon, metallic oxides, such as copper oxide, in the form of crystals or the like; it is necessary that such bodies be extremely small, very precisely manufactured as to specific size and be accurately mounted with respect to other components of the translating device. As is well known in the prior art, semiconductor translating devices of the present type employ such semiconductor bodies in cooperation with two or more leads extending into the devices and other components, which will ultimately serve to provide ohmic or rectifying connections to such devices. In the event that a particular semiconductor body is poorly positioned in partially assembled translating devices, variations in the electrical value of the ultimate finished product will occur, thus making such product unreliable, ineffective and/or completely worthless for the purpose intended.

Serious problems have arisen in regard to the physical handling of the relatively small crystalline semiconductor bodies, which must not only be sorted in many cases so as to present a particular surface, but must also be aligned in a manner permitting placement thereof in operative association with a component or portion of the semiconductor translating device.

Heretofore, it has been the practice manually to pick up an individual crystal and thereafter position the crystal by manual means in position adjacent to and in electrical contact with a portion of a semiconductor translating device. This particular means for assembling such devices has been not only extremely slow, time consuming and expensive, but has been extremely inaccurate, thus creating many worthless end products and an extremely high rejection rate. Inasmuch as a considerable amount of manual labor is involved in the manufacture of semiconductor translating devices, it is extremely important that the time required for assembly of a crystal on a portion of the semiconductor translating devices be reduced to as small an interval as possible, and that the necessary accuracy required in such devices be maintained at a high level of precision, in order that consistently useful semiconductor translating devices may thereby result.

Accordingly, it is one important object of the present invention to provide a novel device for positioning and/or mounting a semiconductor body in a partially assembled semiconductor translating device and in electrical association with a portion of said device.

It is a further important object of the present invention to provide a mounting device for semiconductor bodies wherein means are provided for aligning a semiconductor body or crystal with a portion of a partially assembled semiconductor translating device.

It is a further important object of the present invention to provide a mounting device for semiconductor bodies wherein novel means are provided for supporting said bodies and applying thereto a certain quantity of an adhesive for use thereafter in retaining said bodies in a mounted condition within a semiconductor translating device.

It is still another important object of the present invention to provide a novel device, for mounting semiconductor bodies in partially assembled semiconductor translating devices, that is simple in operation, efficient and accurate in use, reliable in the placement of such bodies, and efficient in operation.

Other and further important objects of the present invention will become apparent from the disclosures in the following detailed specification, appended claims and accompanying drawings, wherein:

Figures 1, 2, 3, 4:
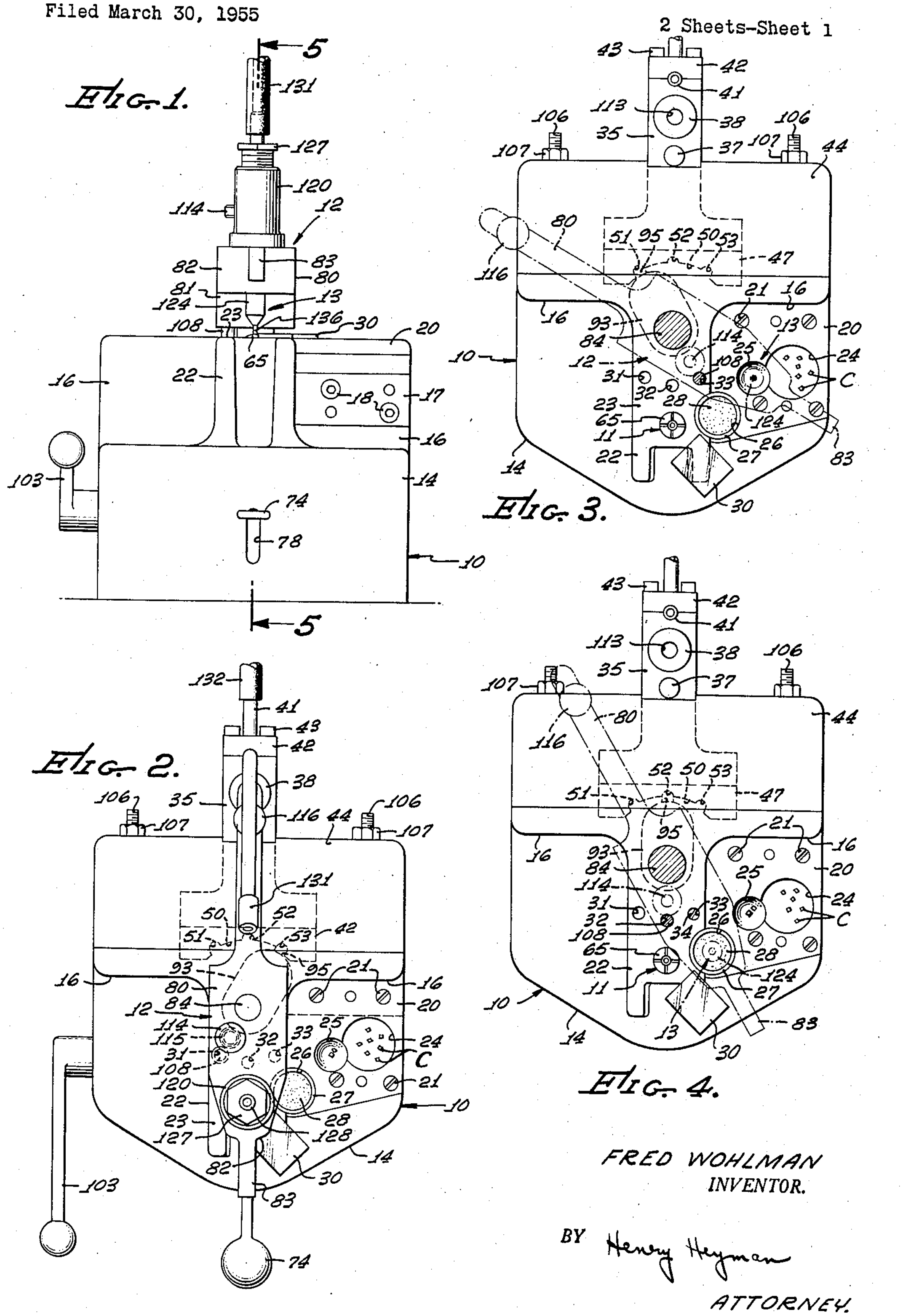
Figure 1 is a front elevational view of the present mounting device for semiconductor bodies.
Fig. 2 is a top plan view of the present device shown in position for disposition of a supported semiconductor body in a partially assembled semiconductor translating device.
Fig. 3 is a semi-diagrammatic view similar to Fig. 2 showing portions of the present device in different positions wherein to permit establishment and placement of a semiconductor body on a nozzle carried by a portion of the device.
Fig. 4 is a semi-diagrammatic view similar to Fig. 3 showing the movable portions of the device in a position wherein an adhesive may be applied to a carried semiconductor body.
Figures 5, 6:
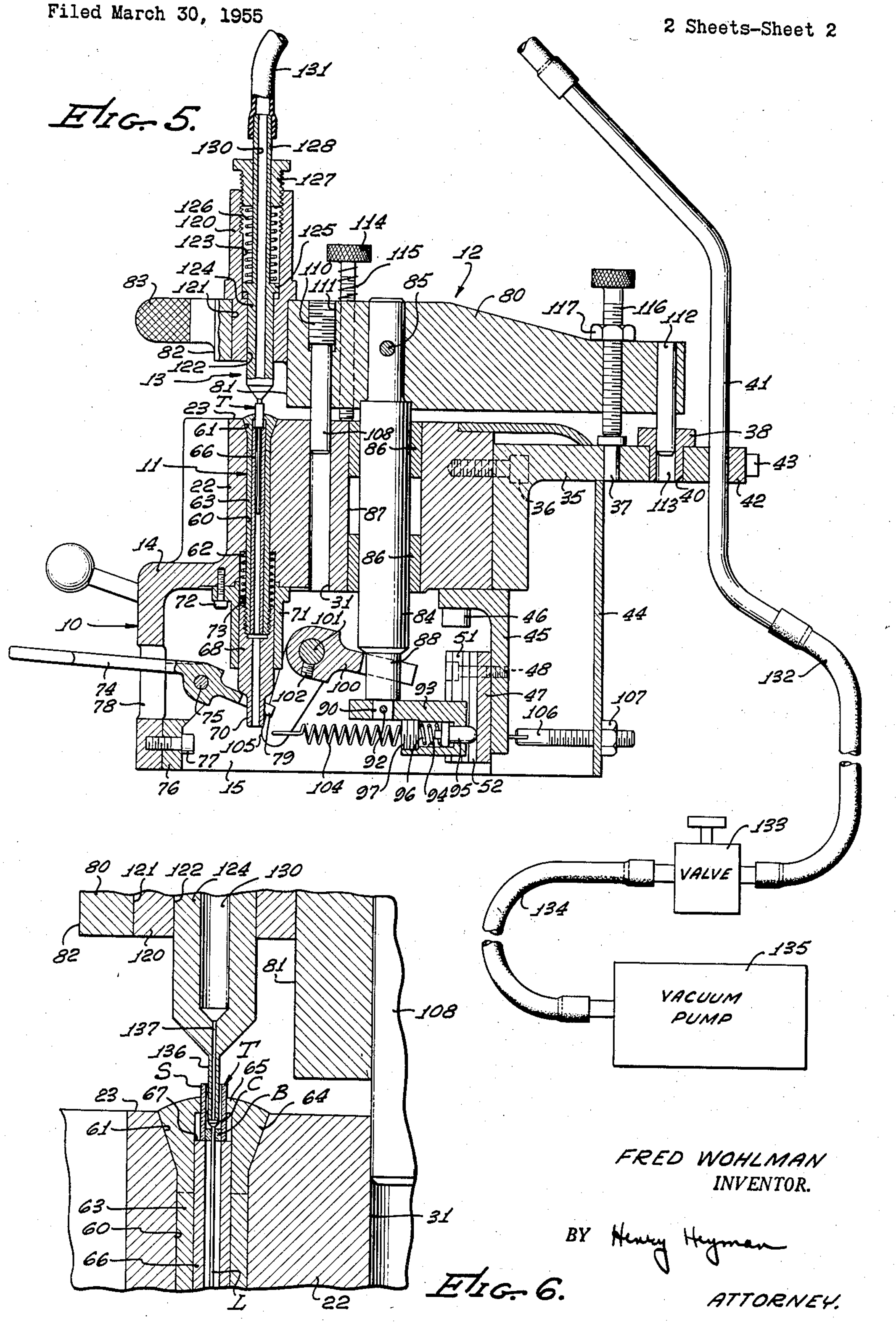
Fig. 5 is a transverse sectional view through the device of the present invention as taken substantially as indicated by line 5—5, Fig. 1.
Fig. 6 is an enlarged fragmentary sectional view showing the means for supporting a partially assembled translating device and details of the manner for disposing a semiconductor body in position therein.

With reference primarily to Figs. 1, 2 and 5, the device of the present invention includes generally a base structure 10, a chuck arrangement 11, a movable head 12 and a nozzle structure 13. The base structure 10 is adapted to rest upon any suitable surface and includes a body 14 having a recess 15 in the lower portion thereof and open toward the bottom of the device. The body 14 has cutaway side portions 16, one of the side portions 16 being adapted to serve as a support for an angular bracket 17 that is attached thereto by means of suitable screws 18. A platform, in the form of plate member 20, is positioned on an upper surface of the angular bracket and retained thereon by means of the screws 21, for example. An outwardly extending base portion 22 is defined between the cutaway portions 16, with the upper surface 23 thereof being coextensive with the upper surface of the plate member 20. The surface 23, together with the upper surface of the plate member 20, serve as working surfaces, there being a recess 24 in the upper surface of the plate member 20 and a second depression or recess 25 communicating peripherally therewith. The recess 25 is generally conical for a purpose to be hereinafter more fully described. Another recess 26 is provided partially in the upper surface of the plate member 20 and partially in the surface 23 of the portion 22, this recess 26 being adapted for retention of a cup 27 which serves to retain a quantity of adhesive 28. The cup 27 may be removably positioned in the recess 26 in order that it may be removed and the adhesive preserved when the device is not in use. The adhesive 28 may be of any suitable type such as, for example, paste including metallic particles, such as gold, for example, the purpose of which also to be later described.

An outward end portion of the body portion 22 is adapted to support a small mirror 30 which serves to enable the operator of the present device more accurately to view the operation thereof. The upper surface 23 of the portion 22 is further provided with a pair of head locating recesses 31 and 32 of substantially equal depth, and a third locating recess 33 (Fig. 4) having a screw 34 therein to permit adjustment as to depth.

The base structure 10 further includes a rearwardly extending angular bracket member 35 that is secured to the body 14 by means of bolts 36 or the like. The horizontally extending portion of the bracket member 35 has a headed stop pin 37 disposed therethrough and a locating bushing 38 also carried thereby in a suitable bore 40. The rearwardmost portion of the bracket member 35 also serves to support a length of tubing 41 that is retained in position by means of a clamp member 42 and screws 43. The rearward portion of the recess 15 in the body 14 is closed by means of a cover member 44 which also extends about an inner portion of the bracket member 35. The lower portion of the body 14, within the recess 15, also serves to support another angular bracket 45 that extends downwardly therefrom and which is retained in position by means of screws 46. The bracket 45 serves to support a position establishing member 47 which is secured thereto by means of bolts 48. The position establishing member 47 has a semicircular elongated slot 50 therein, in which are formed a plurality of smaller elongated semicircular grooves 51, 52 and 53, the purpose of which will be later described.

The chuck mechanism 11 is disposed generally with a vertical bore 60 through the portion 22 of the base structure 10. The upper end of the bore 60 is provided with a conical portion 61 while the lower end thereof has a counterbore 62. A chuck sleeve 63 is positioned for slidable movement in the bore 60, the upper end thereof being tapered as at 64, Fig. 6, for cooperation with the conical portion 61. The portion 64 of the sleeve 63 is longitudinally split in the usual manner in connection with various types of chucks, and is provided with jaw portions as at 65. A locating sleeve 66 is positioned within the sleeve 63 and held against movement therein as by means of a press fit. An upper end 67 of the sleeve 66 is vertically spaced downwardly from the jaws 65 of the chuck, whereby to provide a base for the partially assembled translating device indicated generally at T. The lower end of the sleeve 63 is fitted with an extension 68, of somewhat larger diameter, the lower end of which is reduced in diameter as at 70. The extension 68 is slidably positioned in a bracket 71 that is secured to the body 14 of the base structure 10 and within the recess 15 by means of screws 72. A compression spring 73 is positioned in the counterbore 62, between an inner end of the extension 68 and the base of the counterbore, thus to bias the sleeve 63 in a downward direction and further to bias the jaws 65 of the chuck radially inwardly by action of the portions 64 on the conical upper end portion 61 of the bore 60.

In order to effect operation of the chuck 11, to enable insertion of a partially assembled translating device therein, a lever 74 is mounted on a shaft 75 that is, in turn, carried by a bracket 76. The bracket 76 is mounted within the recess 15 and on the body portion 14 of the base structure, this bracket being retained in position by means of screws 77. The lever 74 extends through an opening 78 in the body portion 14. The inner end of the lever 74 is provided with a forked portion 79 that is adapted for extension over the reduced diameter portion 70 of the extension 68, with side areas of the forked portion 79 being adapted to bear against the lowermost end of the larger diameter portion of the extension 68. It may thus be seen that upon depression of the outer end of the lever 74, the extension 68 together with the sleeve 63 will be moved in an upwardly direction against the compression of the compression spring 73, whereby to permit opening of the jaws of the chuck and insertion of a partially assembled translating device therein.

With reference to Fig. 6, a typical partially assembled translating device is shown as indicated at T and including an elongated lead L that is adapted for disposition within the sleeve 66, a glass bead B that is fused on the lead L and a glass sleeve S that has one end fused to the bead B. The upper end of the lead L extends through the bead B and terminates within the sleeve S. The semiconductor body in the form of a crystal C must be positioned on and affixed, in a precise manner, to this upper end of the lead L.

The movable head structure 12 includes a generally horizontally disposed body portion 80, the outer end of which is stepped as at 81 and again as at 82. The forward or outer end of the portion 80 terminates in a lever portion 83. The body 80 is mounted on a vertically disposed shaft 84 and secured thereto by means of a transverse pin 85. The shaft 84 is in turn supported in suitable bearings 86 disposed in a vertical bore 87 in the body portion 14 of the base structure 10. The shaft 84 is adapted for pivotal and axial movement in the bearings 86. The lower end of the shaft 84 is reduced in diameter as at 88, and still further reduced in diameter at 90, with the reduced diameter portion 90 being adapted to carry an arm 91 that is in turn secured in position by means of a pin 92. The arm 93 has a longitudinally extending bore 94 therein in which a detent 95 is positioned. The detent 95 is urged outwardly from the arm 93 by means of a compression spring 96 that is retained in position by means of a set screw 97. The outer end of the detent 95 is adapted for cooperation with the elongated semicircular grooves 51, 52 and 53 formed in the member 47, in order to locate the pivotal positions of the head 12. The head 12 is adapted for manual pivotal movement from one side to another through use of the lever portion 83 of the head body portion 80.

Vertical movement of the head 12 is accomplished by means of a forked lever 100, the outer end of which is adapted to surround the first reduced diameter portion 88 of the shaft 84. The lever 100 is carried on a shaft 101 and secured thereto by means of a set screw 102. The shaft 101 is positioned in the base recess 15 and pivotally journalled in side portions of the body 14 of the base structure 10. One end of the shaft 101 extends beyond the outer surface of the body 14 and has a lever 103 affixed thereto. It may thus be seen that, upon depression of the lever 103, the shaft 84 will be moved upwardly, thereby moving the head 12 also in an upwardly direction.

Inasmuch as the head 12 is of substantial weight, and in order to reduce the effect of such weight on delicate portions of the partially assembled semiconductor translating device T, the weight of the head 12 is counter-balanced by means of a pair of tension springs 104 that have one of their ends connected to levers 105 that are, in turn, secured to the shaft 101 adjacent sides of the recess 15. The other ends of the tension springs 104 are adjustably connected to the cover 44 by means of studs 106 and nuts 107. The springs 104 are adjusted so that the force thereof, as applied to biasing the shaft 84 in an upwardly direction, will be just slightly less than the gravitational force derived from the weight of the head 80 and the tendency thereof to move the shaft 84 in a downwardly direction.

The angular position of the head 12 is established by means of a guide pin 108 that is depended downwardly from and carried by the body portion 80 of the head 12.

The upper end of the pin 108 has a threaded enlargement 110 that is received in a threaded recess 111, whereby adjustably to position the protruding portion of the pin 108. The pin 108 is adapted for cooperation with the locating recesses 31, 32 and 33, whereby exactly to locate the angular position of the head 12. The rearward portion of the head body portion 80 is provided with a second alignment pin 112 that extends downwardly therefrom and is adapted for cooperation with a bore 113 formed in the bushing 38. The arrangement of the pins 108 and 112 is such as to align the pin 108 with the bore 31 and pin 112 with the bore 113 when the head 12 is in the position shown in Figs. 1, 2 and 5 and the detent 95 is in the groove 53, whereby to provide dual guide means for the angular position of the head when in this particular position. When the head is in the position shown in Fig. 3, the pin 108 is adapted for cooperation with the adjustable recess 33 and when the head is in the portion shown in Fig. 4 the pin 108 is adapted for cooperation with the recess 32. Inasmuch as the force balance on the head 12 is such as just slightly to bias the head in a downward direction, it is necessary that the lever 103 be depressed thus to raise the head 12 and remove the pin 108, and sometimes the pin 112, from the respective locating recesses, in order that the head may be pivoted by means of the lever portion 83.

In order to limit downward travel of the head 12 when in the position shown in Fig. 4, and adjustable stop member 114 is threadably positioned through the head body portion 80 and extends beyond the lower surface thereof. The lowermost end of the adjustable stop member 114 is adapted for engagement with the upper surface 23 of the body portion 22. A compression spring 115 is disposed about the stop member 114 between a head thereon and the upper surface of the body portion 80, whereby to compensate for any tolerance or looseness in the threads of the stop member 114. The vertical downward travel distance of the head 12, when in the position shown in Figs. 1, 2 and 5, is limited by means of a second stop member 116 that is threadably disposed through a rearward portion of the head body portion 80 and adjacent the pin 112. The lower end of the stop member 116 extends beyond the lower portion of the body 80 and is adapted for cooperation with the seat 37. A lock nut 117 is also disposed on the stop member 116 and adapted for cooperation with the upper surface of the body portion 80.

With reference primarily to Figs. 5 and 6, the nozzle structure 13 includes an outer sleeve 120 that is positioned within a bore 121 in a forward portion of the head body portion 80. The sleeve 120 has a vertical bore 122 therein and a counterbore 123, a nozzle member 124 being slidably positioned within the bore 122. The nozzle member 124 has a flange 125 thereon which is disposed in the bore 123. A compression spring 126 is also disposed in the counterbore 123, the outer end position of which is adjustably determined by means of a threaded fitting 127 which engages the sleeve 120. The nozzle member 124 is thereby biased in a downward direction by means of the compression spring 126 and accordingly is resiliently mounted for axial slidable movement in the bore 122. An upper end of the nozzle member 124 is tubular in shape as at 128, there being a passageway 130 formed through the tubular portion 128 and the balance of the nozzle 124. A flexible hose 131 is adapted for atachment of the tubular portion 128 and to one end of the tube 41 carried by the rearward end of the bracket 35. The lower end of tube 41 is adapted for connection with a second hose 132 which extends to a normally closed pneumatic valve 133, there being a third section of flexible hose 134 that extends to a suitable vacuum pump 135. With reference to Fig. 6, the lower end of the nozzle member 124 is reduced in diameter as at 136 whereby to provide an elongated relatively small nozzle through which a relatively small passageway 137 extends. The upper end of the passageway 137 communicates with the passageway

130 through the nozzle member 124 and tubular portion 128 thereof. Thus, upon opening of the valve 133, vacuum will be established in the system, whereby to induce an inward flow of air through the passageways 137 and 130.

In operation of the present device, the head 12 is first moved, by the means described hereinbefore, to the position shown in Fig. 3 with the pin 108 aligned with the adjustable recess 33 and the detent 95 disposed in the groove 51. One of several crystals C that are disposed in the recess 24 in the plate member 20 is moved to the conical recess 25 centered in the bottom portion thereof and the head 12 is permitted to move downwardly to the limit permitted by the adjustable recess 33. This action will bring the lower end of the nozzle 136 closely adjacent to the selected crystal C. By opening the valve 133, vacuum will be established together with inward flow through the passageway 137 in the nozzle 136, whereby to dispose the selected crystal C on the end of the nozzle. In this connection it is to be understood that the crystal C may also be manually placed on the end of the nozzle 136 through use of forceps or the like, the manner of placement being largely dependent upon the size and shape of the crystals or other semiconductor bodies. The mirror 30 serves to aid the operator in positioning the crystal on the end of the nozzle 136. It is also to be understood that the recesses 24 and 25 may have various configurations as may be required for specific selection and positioning of different types of crystals or other semiconductor bodies.

Usually, simultaneously with the establishment of a crystal on the end of the nozzle 136, shortly before or shortly thereafter, the lever 74 is depressed whereby to permit insertion of the partially assembled semiconductor translating device in the jaws of the chuck arrangement 11. The position of the device T is established by engagement of the lower end of the sleeve S with the upper end 67 of the sleeve 66. The lever 74 is then released with the compression spring 73 establishing the proper radial compression upon the sleeve S, so as not to brake the sleeve but to retain the device T against axial or lateral movement in the chuck.

The head 12 is next raised by means of the lever 103 and moved to the position shown in Fig. 4 with the pin 108 aligned with the recess 32 and the detent 95 positioned in the groove 52. The head 12 is then permitted to be moved downwardly with the downward movement thereof being limited by means of the stop member 114 and engagement of the lower end thereof with the surface 23 of the body portion 22. This action will dispose the lower surface of the crystal C, now carried by the nozzle 136, into the adhesive 28 disposed in the cup 27, whereby to pick up a small amount of such adhesive on the crystal. As the quantity of adhesive 28 is reduced, the stop member 114 may be further adjusted in order properly to place the crystal in association with the surface of the adhesive 28.

After application of adhesive to the crystal C, the head 12 is again raised by means of the lever 103 and is moved by means of the lever portion 83 to the position shown in Figs. 1, 2 and 5. Guided by the dual guide means defined by the pins 108 and 112 and with the detent 95 positioned in the groove 53, the head 12 together with the nozzle arrangement 13 is then lowered to dispose the crystal C on a portion (the upper end of the lead L) of the semiconductor translating device. The amount of force applied downwardly to dispose the crystal C on the upper end of the lead L is determined by the force of the compression spring 126, which acts to limit such force and prevent any undue breakage of the elements of the partially assembled translating device T. The lower limit for movement of the head 12 is determined by the position of the stop member 116 and the engagement thereof with the stop member 37. In all cases, there will be a slight compression of the spring 126, whereby to compensate for manufacturing tolerances associated with the assembly of the bead B on the lead L, and the distance of extension of the lead L into the sleeve S. When the crystal C is thus positioned, the adhesive carried by the lower surface thereof will surround the upper end of the lead L and form a fillet thereabout, whereby securely to retain the crystal in position. The valve 133 is thereafter closed thus terminating the vacuum induced inward flow of air through the nozzle 136 and releasing the crystal C from the nozzle. The head 12 may thereafter be raised and moved again to the position shown in Fig. 3, and the chuck 11 opened to permit removal of the partially assembled translating device, so that another cycle may be started.

After positioning of the crystal C on the portion of the semiconductor translating device, this newly completed partial assembly of the semiconductor translating device is removed from the chuck and placed in a suitable oven whereby to fuse the metallic paste, forming the basis for the adhesive 28, to both the lower surface of the crystal C and the upper end of the lead L.

It may thus be seen that the particular device of the present invention is provided with means whereby accurately to locate the various portions thereof and accurately to position a crystal or other type of semiconductor body on a portion of a partially assembled semiconductor translating device. It is also to be seen that operation of the present device is relatively simple, is effective in operation, reliable in use and that the counter-balance arrangement therein enables easy use by operators thereof.

Having thus described the invention and the present embodiments thereof, it is desired to emphasize the fact that many modifications may be resorted to in a manner limited only by a just interpretation of the following claims.

I claim:

1. In a device for mounting a semiconductor body in a partially assembled semicondductor translating device: means for supporting said partially assembled translating device; a manually controllable mounting head arranged for lateral and vertical movement; a nozzle carried by said head; vacuum means adapted for action through said nozzle for retaining a positioned semiconductor body thereon; a receptacle for adhesive; means for aligning said nozzle with said receptacle; first means for limiting vertical movement of said nozzle, together with said body, into adhesive disposed in said receptacle; means for aligning said nozzle with said partially assembled translating device; and second means for limiting vertical downward movement of said nozzle and said body toward said translating device, whereby to position said body, together with said adhesive carried thereby, in contact with a portion of said translating device.

2. In a device for mounting a semiconductor body in a partially assembled semiconductor translating device, the combination of: means for supporting said partially assembled translating device; a manually controllable mounting head arranged for lateral and vertical movement; means for biasing said head toward an upper position; a nozzle carried by said head; vacuum means adapted for action through said nozzle for retaining positioned semiconductor body thereon; a receptacle for adhesive; means for aligning said nozzle with said receptacle; first means for limiting vertical downward movement of said nozzle, together with said body, into adhesive disposed in said receptacle; means for aligning said nozzle with said partially assembled translating device; and second means for limiting vertical downward movement of said nozzle and said body toward said translating device, whereby to position said body, together with said adhesive carried thereby, in contact with a portion of said translating device.

3. A device for mounting a semiconductor body in a partially assembled semiconductor translating device comprising: means for supporting said partially assembled translating device; a manually controllable mounting head arranged for lateral and vertical movement; means for biasing said head toward an upper position; a resiliently mounted nozzle carried by said head; vacuum means adapted for action through said nozzle for retaining a manually positioned semiconductor body thereon; a receptacle for adhesive; means for aligning said nozzle with said receptacle; first means for limiting vertical downward movement of said nozzle, together with said body, into adhesive disposed in said receptacle; dual means for aligning said nozzle with said partially assembled translating device; and second means for limiting vertical downward movement of said nozzle and said body toward said translating device, whereby to position said body, together with said adhesive carried thereby, in contact with a portion of said translating device.

4. In a device for mounting a semiconductor body in a partially assembled semiconductor translating device: means for supporting said partially assembled translating device; a manually controllable mounting head arranged for lateral and vertical movement; a nozzle carried by said head; vacuum means adapted for action through said nozzle for retaining a positioned semiconductor body thereon; means for supporting said head and said nozzle adjacent an upper limit of vertical travel thereof during said positioning of said body thereon; a receptacle for adhesive; means for aligning said nozzle with said receptacle; first means for limiting vertical downward movement of said nozzle, together with said body, into adhesive disposed in said receptacle; means for aligning said nozzle with said partially assembled translating device; second means for limiting vertical downward movement of said nozzle and said body toward said translating device, whereby to position said body, together with said adhesive carried thereby, in contact with a portion of said translating device; and means for controlling said vacuum means.

5. A device for mounting a semiconductor body in a partially assembled semiconductor translating device comprising: means for supporting said partially assembled translating device; a manually controllable mounting head arranged for lateral and vertical movement; means for biasing said head toward an upper position; a nozzle carried by said head; vacuum means adapted for action through said nozzle for retaining a positioned semiconductor body thereon; means for supporting said head and said nozzle adjacent an upper limit of vertical travel thereof during said positioning of said body thereon; a receptacle for adhesive; means for aligning said nozzle with said receptacle; first means for limiting vertical downward movement of said nozzle, together with said body, into adhesive disposed in said receptacle; means for aligning said nozzle with said partially assembled translating device; second means for limiting vertical downward movement of said nozzle and said body toward said translating device, whereby to position said body, together with said adhesive carried thereby in contact with a portion of said translating device; and manually operable means for controlling said vacuum means.

6. In a device for mounting a semi-conductor body in a partially assembled semiconductor translating device, the combination of: means for supporting said partially assembled translating device; a manually controllable mounting head and arranged for lateral and vertical movement; means for biasing said head toward an upper position; a vertically resiliently mounted nozzle carried by said head; vacuum means adapted for action through said nozzle for retaining a manually positioned semiconductor body thereon; means for supporting said head and said nozzle adjacent an upper limit of vertical travel thereof during said positioning of said body thereon; a receptacle for adhesive; means for aligning said nozzle with said receptacle; first adjustable means for limiting vertical downward movement of said nozzle, together with said body, into adhesive disposed in said receptacle; dual guide means for aligning said nozzle with said partially assembled translating device; second adjustable means for limiting vertical downward movement of said nozzle and said body toward said translating device, whereby to position said body, together with said adhesive carried thereby, in contact with a portion of said translating device; and manually operable means for controlling said vacuum means.

7. In a device for mounting a semiconductor body in a partially assembled semiconductor translating device, the combination of: means for supporting said partially assembled translating device; a manually controllable mounting head arranged for lateral and vertical movement; means for biasing said head toward an upper position thereof; a vertically resiliently mounted nozzle carried by said head; vacuum means adapted for action through said nozzle for retaining a semiconductor body thereon; means for positioning said body for pick up by said nozzle; means for supporting said head and said nozzle adjacent an upper limit of vertical travel thereof during said positioning of said body thereon; a receptacle for adhesive; means for aligning said nozzle with said receptacle; first adjustable means for limiting vertical downward movement of said nozzle, together with said body, into adhesive disposed in said receptacle; dual guide means for aligning said nozzle with said partially assembled translating device; second adjustable means for limiting vertical downward movement of said nozzle and said body toward said translating device, whereby to position said body, together with said adhesive carried thereby, in contact with a portion of said translating device; and manually operable means for controlling said vacuum means.

8. A device for accurately positioning and affixing a semiconductor body on a portion of a partially assembled semi-conductor translating device comprising, in combination: a base structure; a head mounted on said base structure and adapted for lateral and vertical movement; a nozzle carried by said head; means for resiliently supporting said nozzle relative to said head; a chuck mounted on said base structure; means for biasing said chuck toward a closed position; means for manually opening said chuck for insertion of said partially assembled semi-conductor translating device therein; means for selectively creating an inward flow of air through said nozzle; receptacle means carried by said base structure for retaining a supply of adhesive; multiposition locating means for said head whereby said head may be aligned in a first position to permit the placement of said semiconductor body on said nozzle, and in a second position with respect to said adhesive receptacle means, and in a third position with respect to said translating device; means for limiting vertical downward movement of said head and said nozzle in all of the various positions thereof; and manual means for raising and lowering said head and said nozzle, whereby to permit placement of a semiconductor body on said nozzle, to apply a quantity of said adhesive to said body in said second position of said head and thereafter to position said body in said translating device in said third position of said head.

9. A device according to claim 8 wherein spring biased detent means are provided for locating lateral positions of said head in all vertical positions thereof.

10. A device according to claim 8 wherein sleeve means are associated with said chuck for vertically locating said partially assembled semiconductor translating device with respect to said chuck and said base structure.

11. A device according to claim 8 wherein dual alignment pins are utilized for controlling the position of said head and said nozzle during placement of said body on said portion of said partially assembled semiconductor translating device.

12. A device according to claim 8 wherein independent means are provided for limiting said vertical downward movement of said head and said nozzle for each of the fixed lateral positions thereof.

13. A device according to claim 12 wherein said independent means comprises at least two threadably adjustable stop members having lower free ends engageable with said base structure.

14. A device according to claim 13 wherein said stop members are biased into contact with said base structure by force of the weight of said head and wherein spring means are provided between said base structure and said head for partially offsetting said force.

References Cited in the file of this patent

FOREIGN PATENTS 480,717 Canada ---------------- Jan. 29, 1952